(12) United States Patent
Takahashi et al.

(10) Patent No.: US 11,935,591 B2
(45) Date of Patent: Mar. 19, 2024

(54) VOLTAGE APPLICATIONS TO A MEMORY CELL INCLUDING A RESISTANCE CHANGE MEMORY ELEMENT IN SERIES WITH A TWO-TERMINAL SWITCHING ELEMENT

(71) Applicant: Kioxia Corporation, Tokyo (JP)

(72) Inventors: Masahiro Takahashi, Yokohama Kanagawa (JP); Hiroshi Ito, Yokohama Kanagawa (JP); Ryousuke Takizawa, Naka Kanagawa (JP)

(73) Assignee: Kioxia Corporation, Tokyo (JP)

( * ) Notice: Subject to any disclaimer, the term of this patent is extended or adjusted under 35 U.S.C. 154(b) by 213 days.

(21) Appl. No.: 17/549,337

(22) Filed: Dec. 13, 2021

(65) Prior Publication Data

US 2022/0406374 A1   Dec. 22, 2022

(30) Foreign Application Priority Data

Jun. 21, 2021   (JP) .................................. 2021-102404

(51) Int. Cl.
*G11C 13/00* (2006.01)
*G11C 5/06* (2006.01)

(52) U.S. Cl.
CPC .............. *G11C 13/004* (2013.01); *G11C 5/06* (2013.01); *G11C 13/0038* (2013.01); *G11C 13/0069* (2013.01)

(58) Field of Classification Search
None
See application file for complete search history.

(56) References Cited

U.S. PATENT DOCUMENTS

| | | | |
|---|---|---|---|
| 10,056,139 B2 | 8/2018 | Qawami et al. | |
| 10,600,481 B2 | 3/2020 | Pirovano et al. | |
| 10,777,275 B2 | 9/2020 | Pirovano et al. | |
| 2006/0227592 A1* | 10/2006 | Parkinson | G11C 11/5678 365/148 |
| 2006/0233019 A1* | 10/2006 | Kostylev | G11C 13/0004 365/163 |
| 2015/0074326 A1* | 3/2015 | Castro | G06F 3/061 711/101 |
| 2019/0206491 A1 | 7/2019 | Banerjee | |

* cited by examiner

*Primary Examiner* — J. H. Hur
(74) *Attorney, Agent, or Firm* — Foley & Lardner LLP

(57) ABSTRACT

According to one embodiment, a memory device includes a first wiring line, a second wiring line, a memory cell connected between the first and second wiring lines, including a resistance change memory element having first and second resistance states, and a two-terminal switching element connected in series to the resistance change memory element, and a voltage application circuit which applies a write voltage signal having a first polarity and setting a desired resistance state to the resistance change memory element, to the memory cell, and applies, after the write voltage signal is applied to the memory cell, a second polarity voltage signal having a magnitude that prevents the two-terminal switching element from being set to the on-state, to the memory cell.

15 Claims, 13 Drawing Sheets

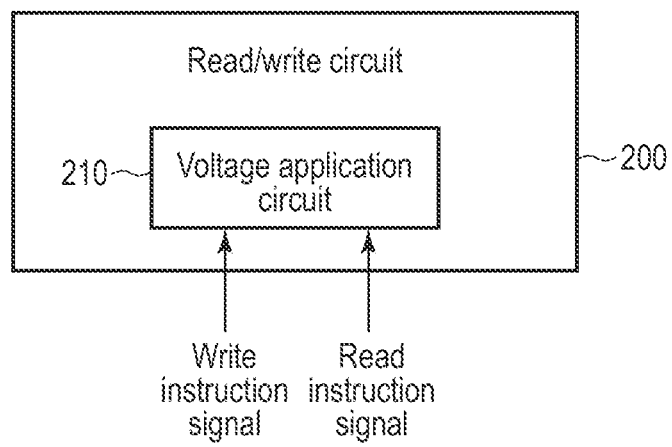
F I G. 7
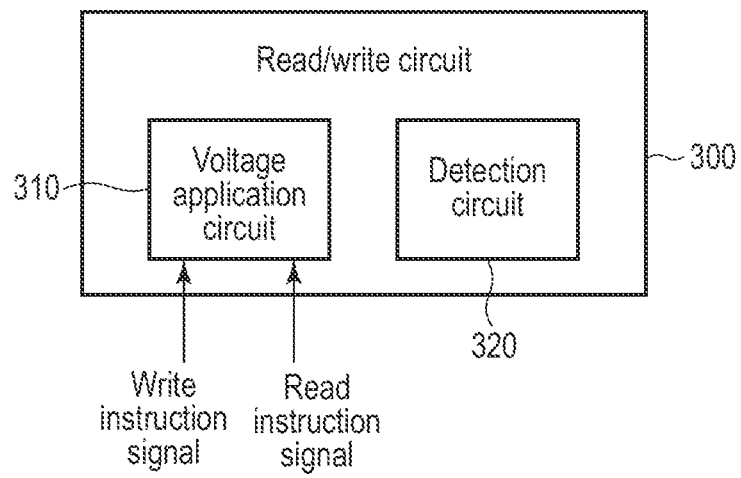
F I G. 8

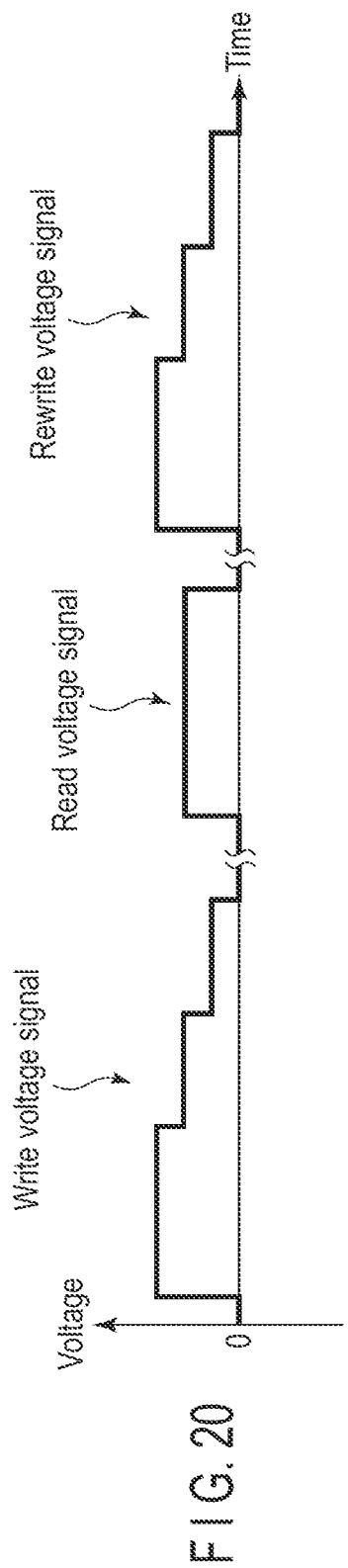
F I G. 20
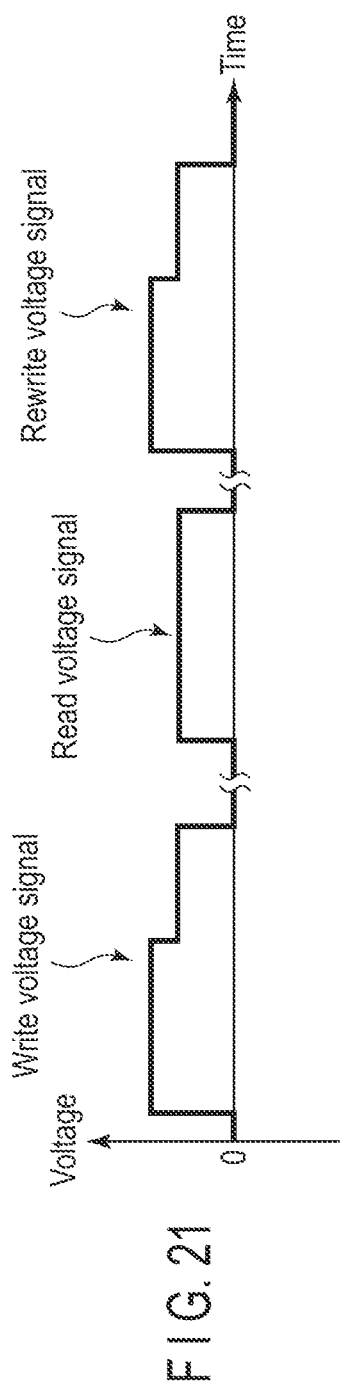
F I G. 21
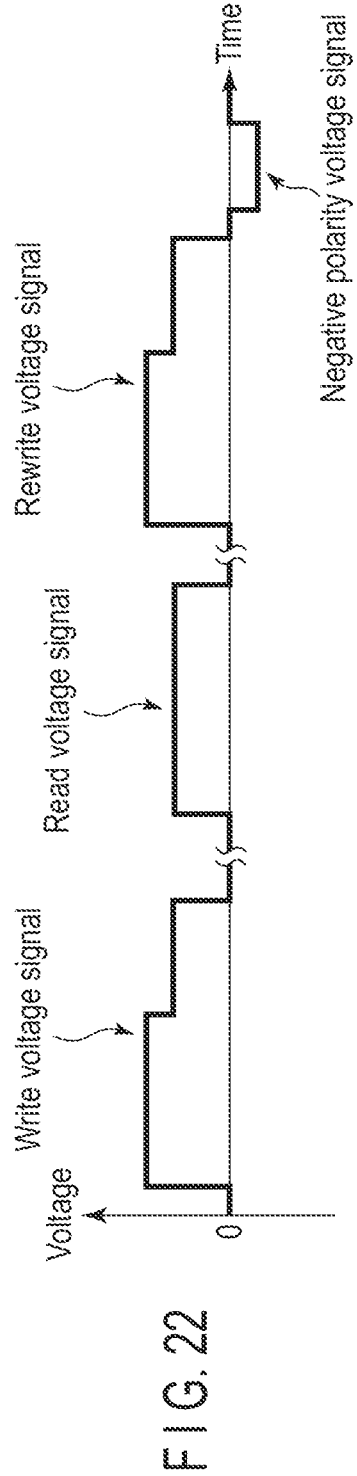
F I G. 22

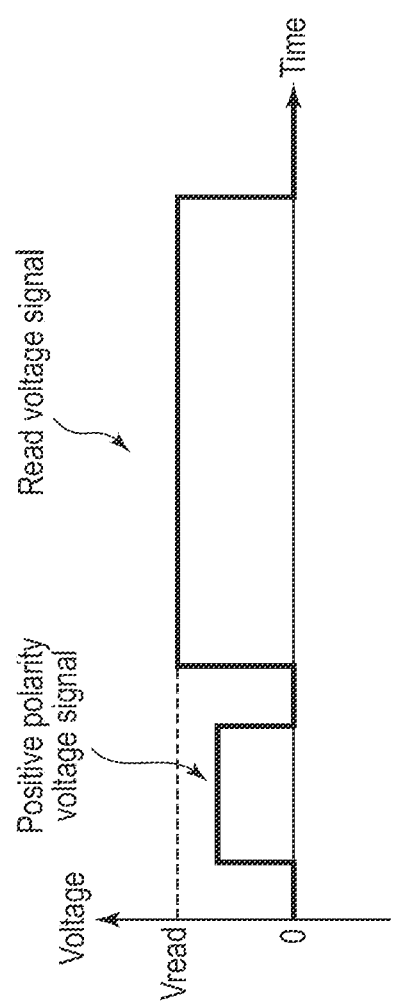
F I G. 25

VOLTAGE APPLICATIONS TO A MEMORY CELL INCLUDING A RESISTANCE CHANGE MEMORY ELEMENT IN SERIES WITH A TWO-TERMINAL SWITCHING ELEMENT

CROSS-REFERENCE TO RELATED APPLICATIONS

This application is based upon and claims the benefit of priority from Japanese Patent Application No. 2021-102404, filed Jun. 21, 2021, the entire contents of which are incorporated herein by reference.

FIELD

Embodiments described herein relate generally to a memory device.

BACKGROUND

Nonvolatile memory devices in which a plurality of memory cells each including a resistance change memory element and a switching element (selector element) are integrated on a semiconductor substrate have been proposed.

BRIEF DESCRIPTION OF THE DRAWINGS

FIG. 7 is a block diagram showing a functional configuration of a read/write circuit of the memory device according to the first embodiment.

FIG. 8 is a block diagram showing functional configuration of a read/write circuit of the memory device according to the first embodiment.

FIG. 20 is a timing diagram showing a refresh operation when a set state is set to a memory cell in the memory device of the third embodiment.

FIG. 21 is a timing diagram showing a first example of the refresh operation when a reset state is set to a memory cell in the memory device of the third embodiment.

FIG. 22 is a timing diagram showing a second example of the refresh operation when a reset state is set to a memory cell in the memory device of the third embodiment.

FIG. 25 is a timing diagram showing a voltage signal applied to a memory cell when a read operation is carried out in the memory device according to the fourth embodiment.

DETAILED DESCRIPTION

In general, according to one embodiment, a memory device includes: a first wiring line extending along a first direction; a second wiring line extending along a second direction intersecting the first direction; a memory cell connected between the first wiring line and the second wiring line, including a resistance change memory element having a first resistance state and a second resistance state having a resistance higher than that of the first resistance state, and a two-terminal switching element connected in series to the resistance change memory element, and storing data based on a resistance state set to the resistance change memory element; and a voltage application circuit which applies a write voltage signal having a first polarity and setting a desired resistance state to the resistance change memory element by setting the two-terminal switching element to an on-state, to the memory cell, and applies, after the write voltage signal is applied to the memory cell, a second polarity voltage signal having a second polarity opposite to the first polarity and having a magnitude that prevents the two-terminal switching element from being set to the on-state, to the memory cell.

The embodiments will now be described with reference to the accompanying drawings.

First Embodiment

Figure 1:
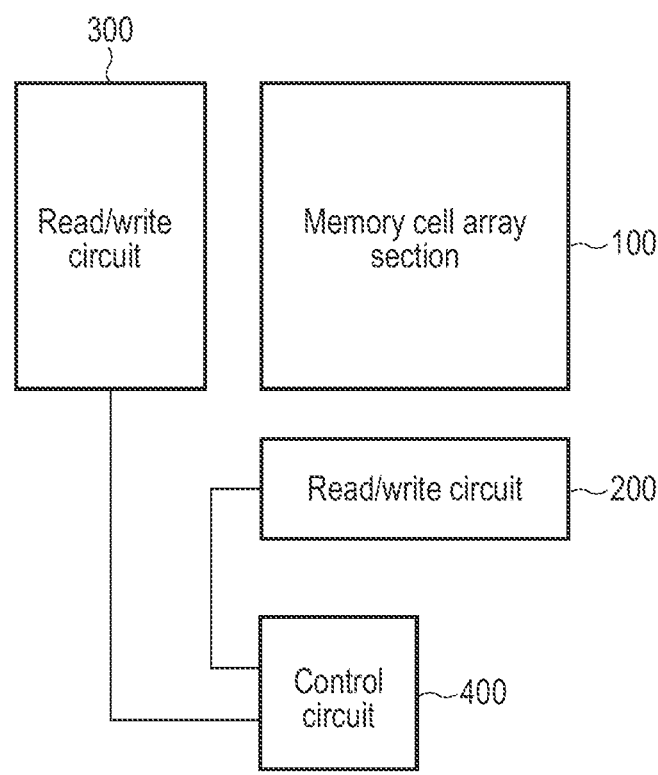
FIG. 1 is a block diagram showing an overall schematic configuration of a memory device of the first embodiment.

FIG. 1 is a block diagram showing an overall schematic configuration of a memory device (resistance change type nonvolatile memory device) according to the first embodiment.

The memory device of this embodiment comprises a memory cell array section 100 in which a plurality of memory cells are arranged in an array, read/write circuits 200 and 300 which carry out read and write operations with respect to the memory cells, and a control circuit 400 which controls the read/write circuits 200 and 300.

Figure 2:
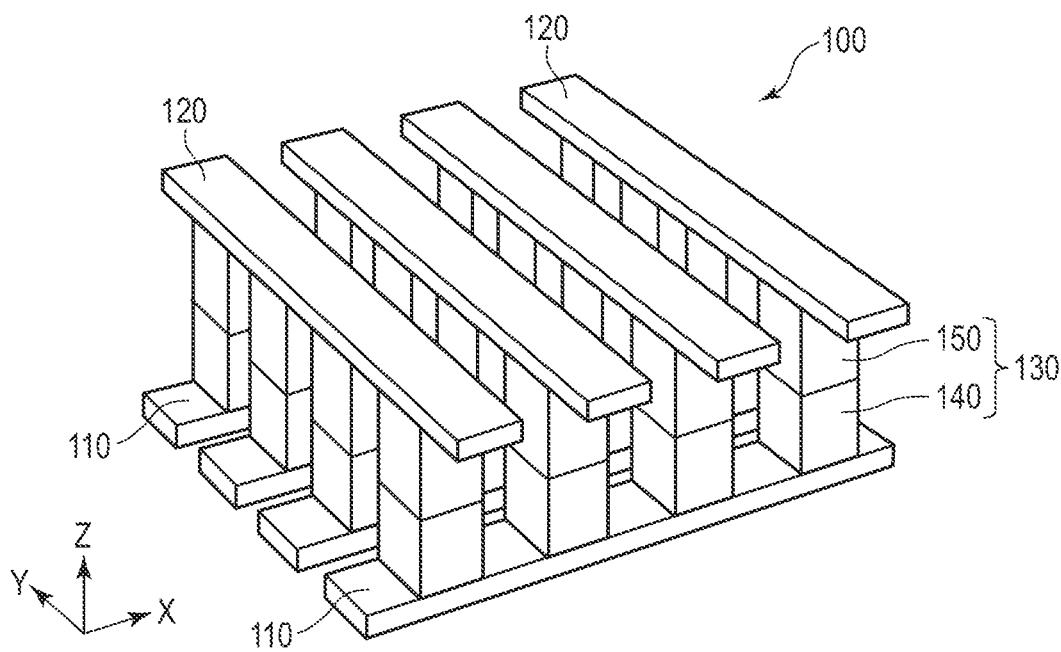
FIG. 2 is a perspective view schematically showing a configuration of a memory cell array section of the memory device according to the first embodiment.

FIG. 2 is a perspective view schematically showing a configuration of the memory cell array section 100.

The memory cell array section 100 is provided on a lower region (not shown) including a semiconductor substrate (not shown), and comprises a plurality of word lines (first wiring lines) 110 extending along an X direction, a plurality of bit lines (second wiring lines) 120 extending along a Y direction intersecting the X direction, and a plurality of memory cells 130 connected between the word lines 110 and the bit lines 120, respectively. Note that the X, Y and Z directions shown in the figure are directions that intersect each other. More specifically, the X, Y and Z directions are orthogonal to each other.

The word lines 110 and the bit lines 120 are connected to the read/write circuit 200 and the read/write circuit 300, respectively. In FIG. 2, the word lines 110 are located on a lower layer side and the bit lines 120 are located on an upper layer side, but the word lines 110 may be located on the upper layer side and the bit lines 120 may be located on the lower layer side.

The memory cell 130 includes a nonvolatile resistance change memory element 140 and a selector element (two-terminal switching element) 150 connected in series to the resistance change memory element 140. In FIG. 2, the resistance change memory element 140 is located on a lower layer side and the selector element 150 is located on an upper layer side, but the resistance change memory element 140 may be located on the upper layer side and the selector element 150 may be located on the lower layer side.

Figure 3:
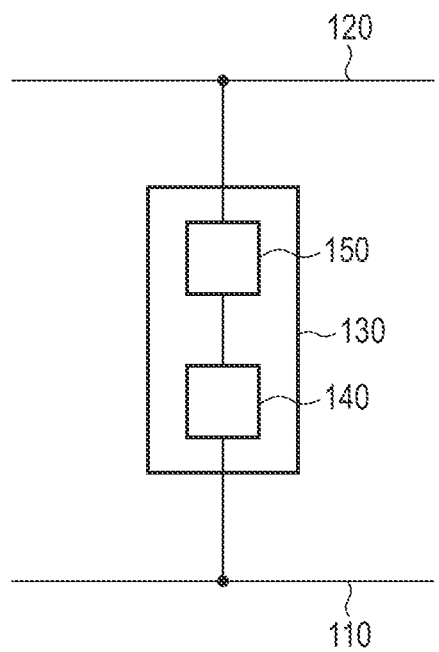
FIG. 3 is an equivalent circuit diagram showing the relationship between word lines, bit lines and memory cells in the memory device of the first embodiment.

FIG. 3 is an equivalent circuit diagram showing the relationship between a word line 110, a bit line 120 and a memory cell 130.

As shown in FIG. 3, the memory cell 130 including a serial connection of a resistance change memory element 140 and a selector element 150 is connected between the word line 110 and the bit line 120. In FIG. 3, the resistance change memory element 140 is connected to the word line 110 and the selector element 150 is connected to the bit line 120, but the selector element 150 may be connected to the word line 110 and the resistance change memory element 140 may be connected to the bit line 120.

Figure 4:
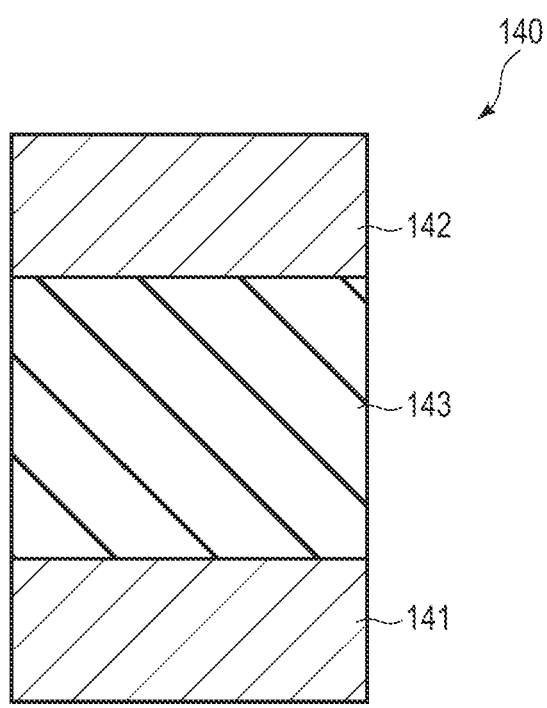
FIG. 4 is a cross-sectional view schematically showing a configuration of a resistance change memory element of the memory device of the first embodiment.

FIG. 4 is a cross-sectional view schematically showing a configuration of the resistance change memory element 140.

The resistance change memory element 140 includes a bottom electrode 141, a top electrode 142 and a resistance change layer 143 provided between the bottom electrode 141 and the top electrode 142. That is, the resistance change memory element 140 has a stacked structure in which the bottom electrode 141, the resistance change layer 143 and the top electrode 142 are stacked along the Z direction show in FIG. 2.

In the resistance change memory element 140, the resistance change layer 143 generates heat by the write signal, and the internal structure of the resistance change layer 143 changes. Thus, the element can exhibit a low-resistance state (first resistance state) and a high-resistance state (second resistance state) having a resistance value higher than that of the low-resistance state according to the write signal. Therefore, the memory cell 130 can store binary data based on the resistance state set in the resistance change memory element 140.

For the resistance change memory element 140, for example, a phase change memory (PCM) element or an interfacial phase change memory (iPCM) element can be used.

Figure 5:
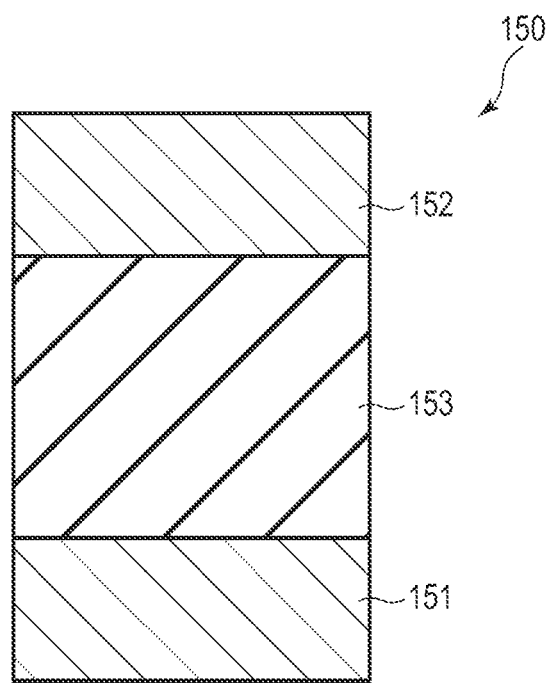
FIG. 5 is a cross-sectional view schematically showing the configuration of a selector element of the memory device according to the first embodiment.

FIG. 5 is a cross-sectional view schematically showing a configuration of the selector element (two-terminal switching element).

The selector element 150 includes a bottom electrode 151, a top electrode 152 and a selector material layer 153 provided between the bottom electrode 151 and the top electrode 152, and has a nonlinear current-voltage characteristic.

Figure 6:
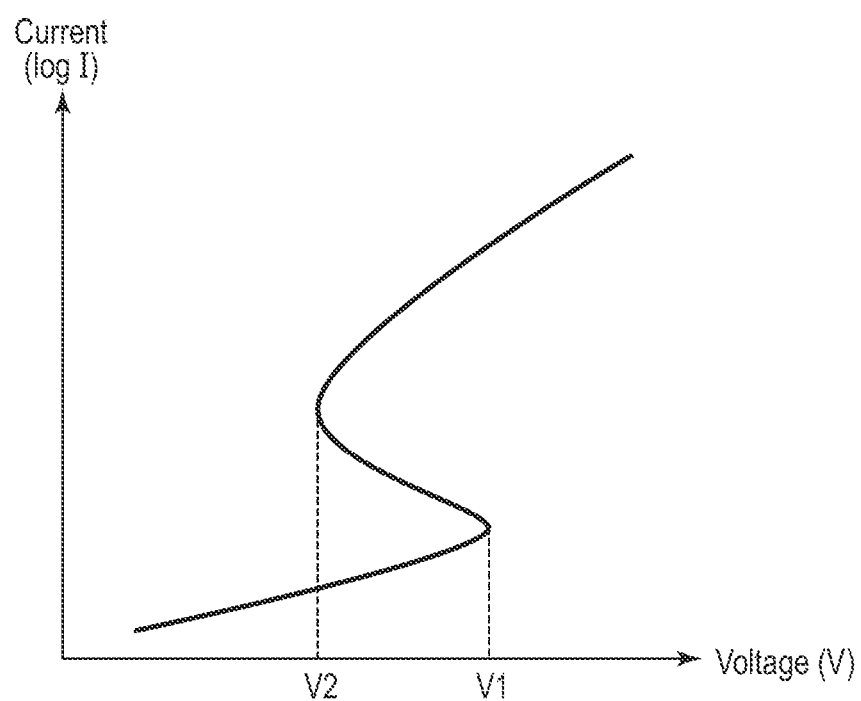
FIG. 6 is a schematic diagram of the current-voltage characteristics of the selector element of the memory device according to the first embodiment.

FIG. 6 is a diagram schematically illustrating the current-voltage characteristics of the selector element 150.

The selector element 150 has such characteristics that it changes from an off-state to an on-state when the voltage applied between the two terminals increases to be a first voltage (on-voltage) V1 or higher, and changes from the on-state to the off-state when the voltage applied between the two terminals decrease to be a second voltage (off-voltage) V2 or lower, which is lower than the first voltage V1.

When a voltage is applied between the word line 110 and the bit line 120 and the voltage applied to the selector element 150 becomes equal to or greater than the first voltage V1, the selector element 150 is placed on the on-state, thus enabling to carry out a write or read with respect to the resistance change memory element 140 connected in series to the selector element 150.

Note that the electrode of the resistance change memory element 140, which is on a selector element 150 side and the electrode of the selector element 150, which is on a resistance change memory element 140 side may be common. For example, in the examples shown in FIGS. 2, 3, 4 and 5, the top electrode 142 of the resistance change memory element 140 and the bottom electrode 151 of the selector element 150 may be common.

The wiring lines (the word line 110, the bit line 120) may be used as the electrode of the resistance change memory element 140 or the electrode of the selector element 150. For example, in the examples shown in FIGS. 2, 3, 4 and 5, the word line 110 may be used as the bottom electrode 141 of the resistance change memory element 140, and the bit line 120 may be used as the top electrode 152 of the selector element 150.

FIG. 7 is a block diagram showing a functional configuration of the read/write circuit 200 shown in FIG. 1.

The read/write circuit 200 has a function of supplying voltage signals to the memory cell 130 via the word lines 110 during read and write operations, and includes a voltage application circuit 210.

FIG. 8 is a block diagram showing a functional configuration of the read/write circuit 300 shown in FIG. 1.

The read/write circuit 300 has a function of supplying voltage signals to the memory cells 130 via the bit lines 120 during the read and write operations, and includes a voltage application circuit 310. The read/write circuit 300 has a function of reading the data stored in the memory cell 130 via the bit line 120 during the read operation, and includes a detection circuit 320.

Next, the operation of this embodiment will be described.

Figure 9:
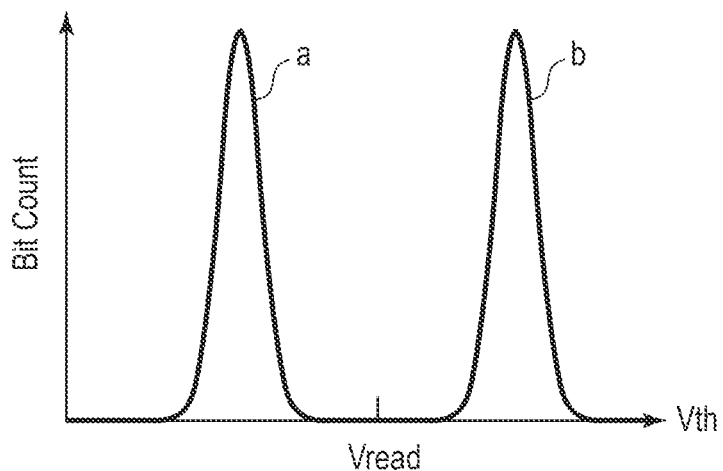
FIG. 9 is a diagram showing general distribution characteristics of a threshold voltage of a memory cell in the memory device of the first embodiment.

FIG. 9 is a diagram showing general distribution characteristics of the threshold voltage Vth of the memory cell (the voltage applied to the memory cell when the selector element changes from the off-state to the on-state). The horizontal axis indicates the threshold voltage Vth of the memory cell, and the vertical axis indicates the number of memory cells (bit count) having the threshold voltage Vth shown on the horizontal axis.

In FIG. 9, a distribution characteristic a is the distribution characteristic of the threshold voltage Vth of the memory cell when the low-resistance state is set to the resistance change memory element, and a distribution characteristic b is the distribution characteristic of the threshold voltage Vth of the memory cell when the high-resistance state is set to the resistance change memory element.

As already described, each memory cell comprises a resistance change memory element and a selector element connected in series to each other. With this configuration, in order to set the selector element in the on-state, it is necessary to apply a higher voltage to the memory cell when the high-resistance state is set to the resistance change memory element than when the low-resistance state is set to the resistance change memory element. Therefore, as shown in FIG. 9, the distribution characteristic b of the threshold voltage Vth in the case where the high-resistance state is set to the resistance change memory element is located relatively on a high voltage side than the distribution characteristic a of the threshold voltage Vth in the case where the low-resistance state is set to the resistance change memory element. Therefore, the voltage to be applied to the memory cell to set the selector element to the on-state when the high-resistance state is set to the resistance change memory element is higher than the voltage to be applied to the memory cell to set the selector element to the on-state when the low-resistance state is set to the resistance change memory element.

Based on the above, it is possible to detect the resistance state set to the resistance change memory element by applying a voltage between the distribution characteristics a and b as a read voltage signal to the memory cell during the reading operation. In other words, by applying the voltage applied to the word line with reference to the bit line voltage to the memory cell as a read voltage Vread, it is possible to detect the resistance state set to the resistance change memory element and read out the data stored in the memory cell. Generally, by applying, to the memory cell, the read voltage Vread with which the selector element is set to the on-state when the low-resistance state is set to the resistance change memory element and the selector element is set to the off-state when the high-resistance state is set to the resistance change memory element, it is possible to read out the data stored in the memory cell.

Next, the write operation of the memory device of the embodiment will be described.

In the write operation, a low-resistance state or a high-resistance state is set to the resistance change memory element 140 according to the falling waveform of the write voltage signal applied to the memory cell 130. More specifically, by applying a voltage with a relatively long fall time to the memory cell 130, a low-resistance state is set to the resistance-change memory element 140, and by applying a voltage with a relatively short fall time to the memory cell 130, a high-resistance state is set to the resistance-change memory element 140.

Figure 10:
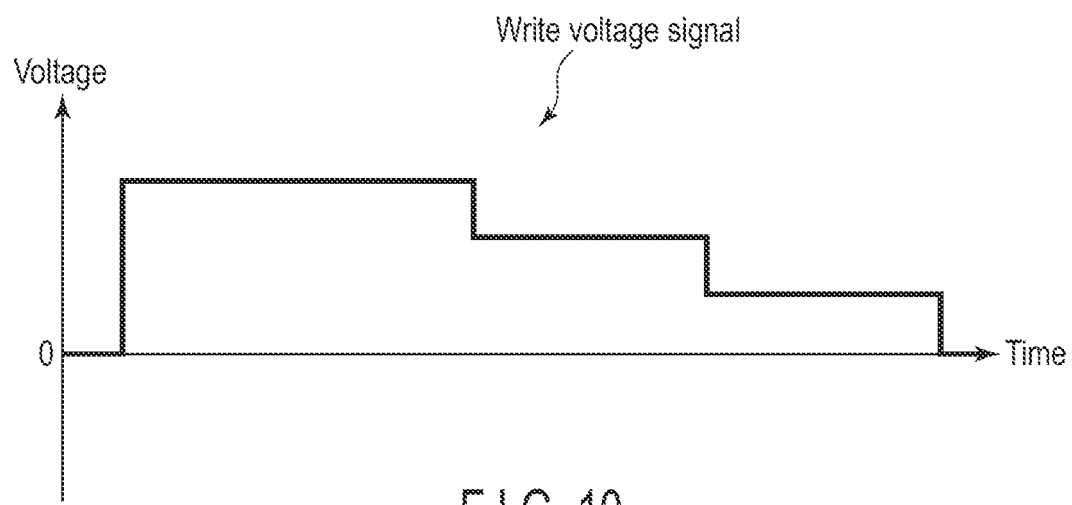
FIG. 10 is a timing diagram showing a voltage signal applied to a memory cell when carrying out a set write in the memory device of the first embodiment.
Figure 11:
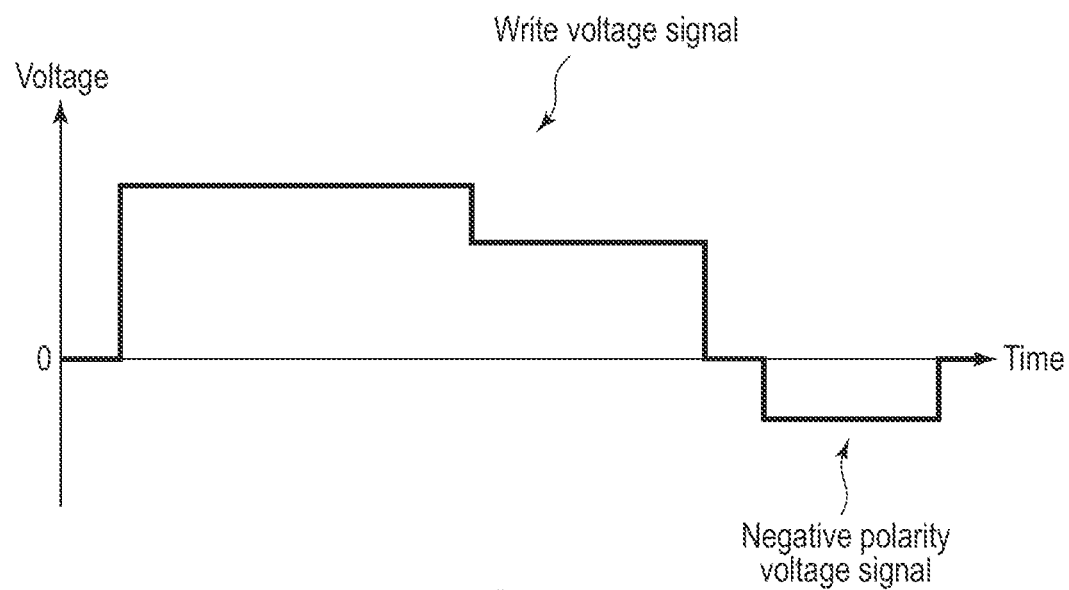
FIG. 11 is a timing diagram showing a voltage signals applied to a memory cell when carrying out a reset write in the memory device of the first embodiment.

FIG. 10 is a timing diagram showing the voltage signal applied to the memory cell 130 when carrying out a set write (a write to set the resistance change memory element 140 to the low-resistance state). FIG. 11 is a timing diagram showing the voltage signal applied to the memory cell 130 when carrying out a reset write (a write to set the resistance change memory element 140 to the high-resistance state).

As shown in FIG. 10, when carrying out a set write, a write voltage signal having a positive polarity (a first polarity) is applied to the memory cell 130. More specifically, a positive polarity voltage having a magnitude that sets the selector element 150 to the on-state, is applied to the memory cell 130, and then a positive polarity voltage having a relatively long fall time is applied to the memory cell 130. Thus, the low-resistance state is set to the resistance change memory element 140.

As shown in FIG. 11, when carrying out a reset write, a write voltage signal having a positive polarity (a first polarity) is applied to the memory cell 130, and then a negative polarity voltage signal (a second polarity voltage signal) having a negative polarity (a second polarity opposite to the first polarity) and a magnitude which does not set the selector element 150 to the on-state is applied to the memory cell 130. More specifically, first, a positive polarity voltage having a magnitude that sets the selector element 150 to the on-state is applied to the memory cell 130, and then a positive polarity voltage having a relatively short fall time is applied to the memory cell 130. Thus, the high-resistance state is set to the resistance change memory element 140. Thereafter, a negative polarity voltage signal having a magnitude that does not set the selector element 150 to the on-state is applied to the memory cell 130.

In this embodiment, by carrying out the write operation as described above, it is possible to obtain a nonvolatile memory device having high reliability. The following are detailed explanations thereof.

First, general problems of selector elements will be described.

Figure 12:
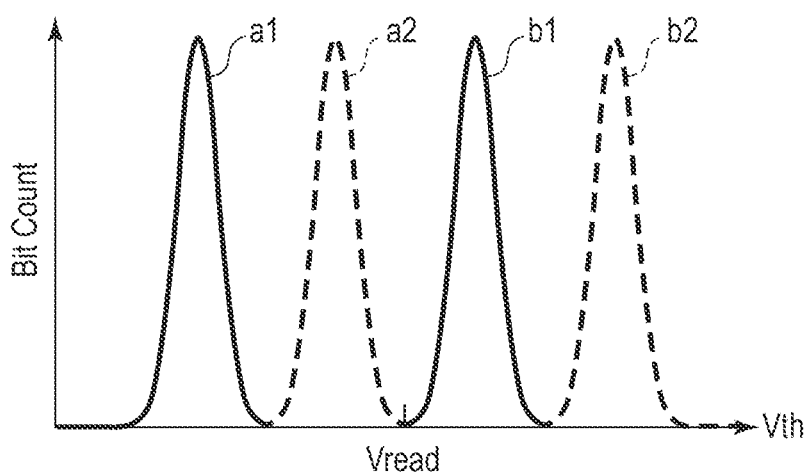
FIG. 12 is a diagram showing a time variation in a comparative example of the distribution of the threshold voltage of a memory cell in the memory device according to the first embodiment.

FIG. 12 is a diagram showing the time variation in the distribution of the threshold voltage Vth of the memory cell in a comparative example. The horizontal axis indicates the threshold voltage Vth of the memory cells, and the vertical axis indicates the number of memory cells (bit count) having the threshold voltage Vth shown on the horizontal axis.

In FIG. 12, a distribution characteristic a1 is the distribution characteristic of the threshold voltage Vth immediately after a set write is carried out onto to the resistance change memory element, and a distribution characteristic a2 is the distribution characteristic of the threshold voltage Vth after a predetermined time period has passed after the set write to the resistance change memory element. The distribution characteristic b1 is the distribution characteristic of the threshold voltage Vth immediately after a reset write is carried out onto the resistance change memory element, and the distribution characteristic b2 is the distribution characteristic of the threshold voltage Vth after a predetermined time period has passed after the reset write to the resistance change memory element. Note that Vread represents the read voltage applied to the memory cell (the voltage applied to the word line with reference to the bit line voltage).

FIG. 12 illustrates only the distribution characteristics a1 and a2, but in reality, the distribution characteristics after the set write shift continuously along with the elapse of time from the distribution characteristic a1 towards the distribution characteristic a2. Similarly, the distribution characteristics after a reset write continuously shift from the distribution characteristic b1 to the distribution characteristic b2 along with the elapse of time.

As shown in FIG. 12, the threshold voltage Vth of the memory cell increases (shifts in the positive direction) along with the elapse of time after the writing operation in both cases of the set write and the reset write. For example, the threshold voltage Vth increases due to such a phenomenon that elements contained in the selector material layer 153 of the selector element 150 migrate along with the elapse of time to reduce defects in the selector material layer 153. Thus, since the threshold voltage Vth of the memory cell increases with time, it is difficult to ensure a sufficient difference between the threshold voltage Vth in the case of the set write and the threshold voltage Vth in the case of the reset write. In other words, it is difficult to set an appropriate read voltage Vread. As a result, there is a risk that incorrect data may be read from the memory cell during a read, which may cause a decrease in reliability.

Figure 13:
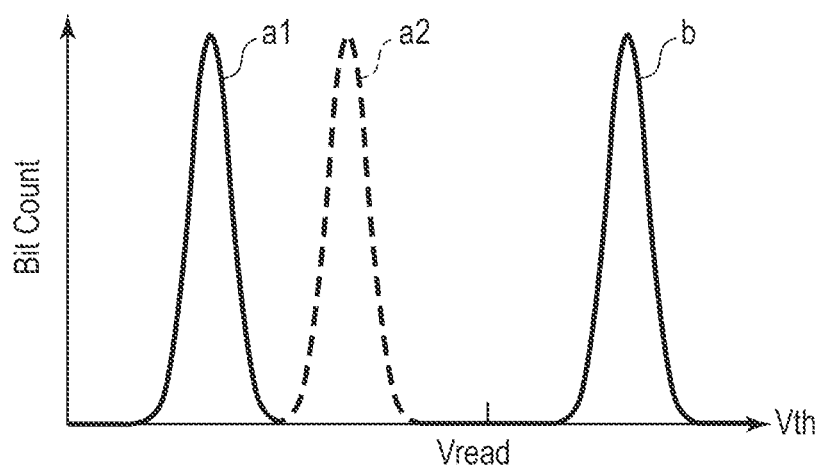
FIG. 13 is a diagram showing the time variation of the distribution of the threshold voltage of a memory cell in the memory device according to the first embodiment.

FIG. 13 shows the time variation of the distribution of the threshold voltage Vth of the memory cell 130 when the write operation of this embodiment, that is, the write operation as shown in FIGS. 10 and 11, is carried out.

In FIG. 13, a distribution characteristic a1 is the distribution characteristic of the threshold voltage Vth immediately after a set write operation is carried out on the resistance change memory element 140, and the distribution characteristic a2 is the distribution characteristic of the threshold voltage Vth after a sufficient time has elapsed after a set write operation is carried out on the resistance change memory element 140. A distribution characteristic b is the distribution characteristic of the threshold voltage Vth immediately after a reset write is carried out on the resistance change memory element 140 and after a sufficient time has elapsed after the reset write. Note that Vread represents the read voltage applied to the memory cell 130 (the voltage applied to the word line with reference to the bit line voltage).

As shown in FIG. 13, the distribution characteristics a1 and a2 in the case of the set write are the same as the distribution characteristics a1 and a2 in FIG. 12. The distribution characteristic b when a reset write is carried out is the same as the distribution characteristic b2 in FIG. 12. That is, in this embodiment, as shown in FIG. 11, when a reset write is carried out, a write voltage signal having a positive polarity is applied to the memory cell 130, and then a negative polarity voltage signal having a negative polarity and a magnitude that does not set the selector element 150 to the on-state is applied to the memory cell 130. Thus, the threshold voltage Vth is shifted in the positive direction in advance.

Therefore, in this embodiment, a sufficient difference can be secured between the threshold voltage Vth in the case of a set write and the threshold voltage Vth in the case of a reset write, and an appropriate read voltage Vread can be set. As a result, correct data can be accurately read out from the memory cell during the read operation, and the reliability can be improved.

The writing method of this embodiment described above will be further described below.

Figure 14:
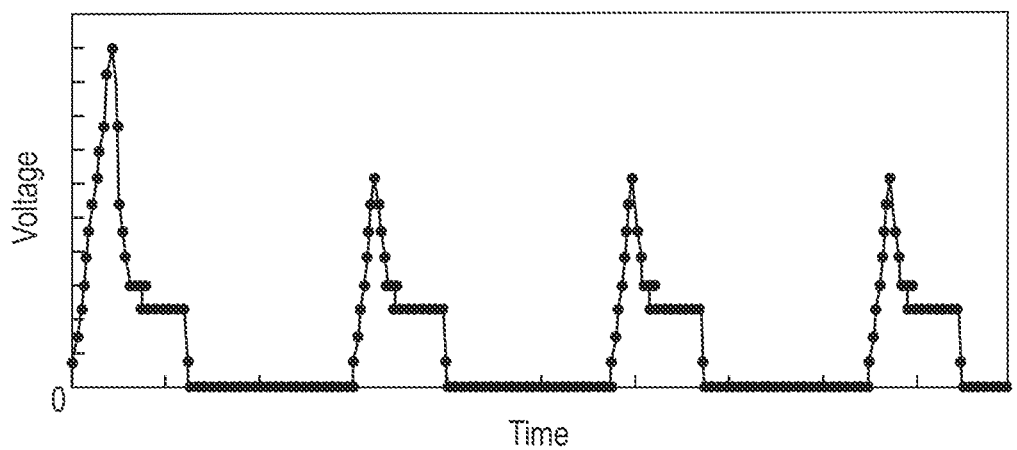
FIG. 14 is a diagram showing results of measurement of the time variation in the characteristics of the selector element in the memory device of the first embodiment.

FIG. 14 is a diagram showing results of the measurement of the time variation in the characteristics of the selector element 150. The horizontal axis represents time, and the vertical axis represents the applied voltage to the selector element 150.

As shown in FIG. 14, when a voltage is applied to the selector element 150 from a steady state (the state of the selector element 150 after a sufficient amount of time has passed since it changes to the off-state), the selector element 150 is set to an on-state with a relatively high on-voltage. When the voltage is applied to the selector element 150 again at a short time interval after the selector element 150 is set to the off-state, the selector element 150 is set to an on state with on-voltage that is relatively lower than the previous on-voltage. Thereafter, similarly, the selector element 150 is set to the on-state with a relatively lower on-voltage.

As can be seen from the above, when the selector element 150 is set to the on-state and then set to the off-state, the on-state voltage subsequently decreases. Therefore, the threshold voltage Vth of the memory cell 130 including the serial connection of the resistance change memory element 140 and the selector element 150 decreases as well after the selector element 150 is set to the off-state from the on-state. Therefore, immediately after a write is carried out on the memory cell 130, the threshold voltage Vth of the memory cell 130 drops significantly. As a result, as shown in FIG. 12, usually, immediately after the write, the threshold voltage Vth takes the curve such as the distribution characteristic a1 in the case of a set write, and the threshold voltage Vth takes the curve such as the distribution characteristic b1 in the case of a reset write.

Figure 15:
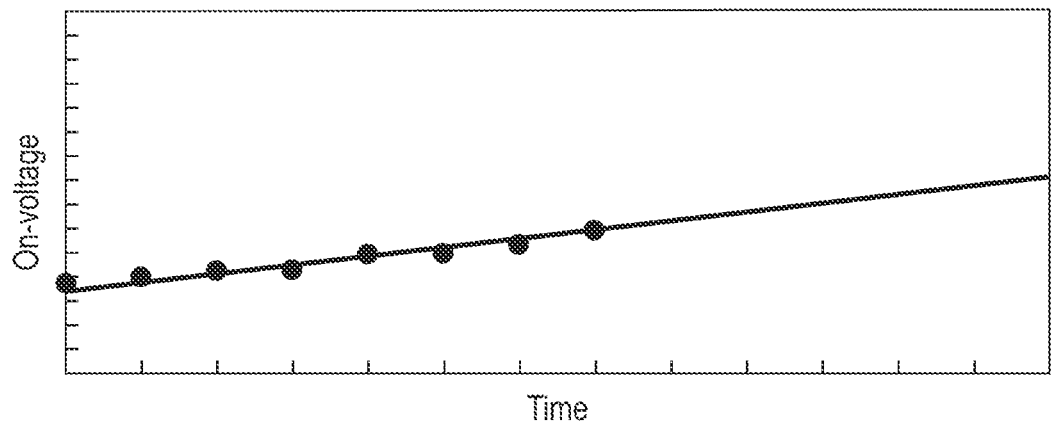
FIG. 15 is a diagram showing results of measurement of the time variation in on-voltage of the selector element in the memory device of the first embodiment.

FIG. 15 is a diagram showing results of measurements of the time variation of the on-voltage of the selector element 150. The horizontal axis represents time (in exponential scale), and the vertical axis represents the on-voltage of the selector element 150. More specifically, the figure illustrates the time variation of the on-voltage when the time from the point where the selector element 150 is set to the on-state and then the selector element 150 is set to the off-state, to, thereafter, the point where the selector element 150 is set to the on-state again, is varied.

As shown in FIG. 15, as the elapsed time from the point where the selector element 150 is set from the on-state to the Off-state and then again to the on-state is increased, the on-voltage increases. Consequently, as shown in FIG. 12, as the time elapses, the threshold voltage Vth of the memory cell 130 shifts from the distribution characteristic a1 to the distribution characteristic a2 in the case of the set write and shifts from the distribution characteristic b1 to the distribution characteristic b2 in the case of the reset write.

As can be seen from the characteristics shown in FIGS. 12, 14 and 15 provided above, the selector element 150 has such characteristics that the on-voltage (the first voltage V1 shown in FIG. 6) decreases when it changes from the off-state to the on-state, and the on-voltage (first voltage V1) increases along with time after it changes to the on-state.

Figure 16:
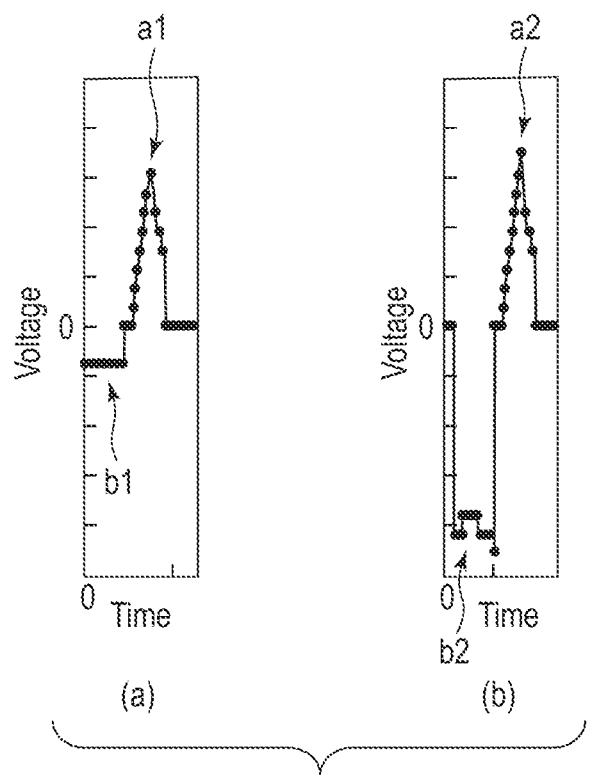
FIG. 16 is a diagram showing results of measurement of the on-characteristics of a selector element 150 when the applied voltage to the selector element is varied in the memory device of the first embodiment.

FIG. 16, in parts (a) and (b), is a diagram showing results of measurement of the ON characteristics of the selector element 150 when the applied voltage to the selector element 150 is varied. The horizontal axis represents the time, and the vertical axis represents the applied voltage to the selector element 150.

Voltages a1 and a2 are on-voltages of positive polarity applied to the selector element 150, and voltages b1 and b2 are voltages of negative polarity applied to the selector element 150.

The negative polarity voltages b1 and b2 shown in FIG. 16, parts (a) and (b), respectively, each have a magnitude that does not set the selector element 150 to the on-state, and the magnitude of the negative polarity voltage b2 is greater than that of the negative polarity voltage b1. Further, the on-voltage a2 shown in FIG. 16, part (b) is increased to be higher than the on-voltage a1 shown in FIG. 16, part (a). Therefore, it can be seen that the positive polarity on-voltage increases (shifts in the positive direction) by applying a negative polarity voltage that has a certain magnitude or larger and a magnitude that does not set the selector element 150 to the on-state.

From the above-provided descriptions, it can be understood that the selector element 150 has a characteristic that the on-voltage (the first voltage V1 shown in FIG. 6) increases as a negative polarity voltage having a certain magnitude is applied after applying a positive polarity voltage on-voltage. Therefore, by applying a negative polarity voltage after the selector element 150 is set to the on-state by applying a positive direction voltage to the selector element 150, the threshold voltage Vth of the memory cell 130 including the serial connection of the resistance change memory element 140 and the selector element 150 can be increased.

Therefore, by applying a negative polarity voltage signal to the memory cell 130 immediately after the selector element 150 is set to the on-state, it is possible to shift the distribution characteristics of the threshold voltage Vth in a positive direction immediately after the write operation. In other words, immediately after the write operation, the threshold voltage Vth takes a curve such as the distribution characteristic a2 in FIG. 12 in the case of a set write, and the threshold voltage Vth takes a curve such as the distribution characteristic b2 in FIG. 12 in the case of a reset write.

But when the threshold voltage Vth is shifted in the positive direction by applying a negative polarity voltage signal in the case of a set write, it is difficult to increase the difference between the threshold voltage Vth in the case of the set write and the threshold voltage Vth in the case of the reset write. Therefore, such a distribution characteristic of the threshold voltage Vth as shown in FIG. 13 can be obtained by not applying a negative polarity voltage signal after the write operation in the case of the set write, and applying a negative polarity voltage signal after the write operation in the case of the reset write.

Based on the above-provided descriptions, such a distribution characteristic of the threshold voltage Vth of the memory cell 130 shown in FIG. 13 can be obtained by applying a voltage signal such as shown in FIG. 10 to the memory cell 130 in the case of the set write operation and applying a voltage signal such as shown in FIG. 11 to the memory cell 130 in the case of the reset write operation. As a result, in this embodiment, it is possible to secure a sufficient difference between the threshold voltage Vth in the case of the set write and the threshold voltage Vth in the case of the reset write, and thus the read voltage Vread can be accurately set. Therefore, in this embodiment, correct data can be accurately read out from the memory cell during the read operation, and a nonvolatile memory device with high reliability can be obtained.

Note that when the selector element 150 is set to the on-state by applying a negative polarity voltage signal after a write operation, current flows in the memory cell 130 in a direction opposite to the normal write direction, which may cause malfunction.

Therefore, the negative polarity voltage signal applied after the write operation needs to be set to such a magnitude that does not set the selector element 150 to the on-state.

Next, a specific write operation of this embodiment will be described.

The write operation is carried out by the voltage application circuit 210 and the voltage application circuit 310 shown in FIGS. 7 and 8. That is, based on a write instruction signal that instructs to apply a write voltage signal to the memory cell 130, the voltage application circuit 210 applies a voltage to one terminal of the memory cell 130 via the word line 110, and the voltage application circuit 310 applies a voltage to the other terminal of the memory cell 130 via the bit line 120. As a result, voltage signals as shown in FIGS. 10 and 11 are applied to the memory cells 130.

Specifically, when a set write is carried out, a voltage signal as shown in FIG. 10 is applied to the memory cell 130. As a result, the selector element 150 is set to the on-state and a low-resistance state is set to the resistance change memory element 140. Immediately after the set write, the threshold voltage Vth of the memory cell 130 takes a curve such as the distribution characteristic a1 in FIG. 13. Thereafter, along with the elapse of time, the threshold voltage Vth of the memory cell 130 shifts to the distribution characteristic a2 in FIG. 13.

When a reset write is carried out, a voltage signal as shown in FIG. 11 is applied to the memory cell 130. As a result, the selector element 150 is set to the on-state and a high-resistance state is set to the resistance change memory element 140. In the reset write, a negative polarity voltage signal is applied to the memory cell 130 immediately after the write voltage signal is applied. Therefore, in the reset write, the threshold voltage Vth is shifted to a high voltage side immediately after the negative polarity voltage signal is applied, and the threshold voltage Vth of the memory cell 130 is maintained at the distribution characteristic b in FIG. 13 immediately after the negative polarity voltage signal is applied.

Next, a specific readout operation of this embodiment will be described.

The read operation is carried out by the voltage application circuit 210, the voltage application circuit 310 and the detection circuit 320 shown in FIGS. 7 and 8. That is, based on a read instruction signal that instructs to apply a read voltage signal to the memory cell 130, the voltage application circuit 210 applies a voltage to one terminal of the memory cell 130 via the word line 110, and the voltage application circuit 310 applies a voltage to the other terminal of the memory cell 130 via the bit line 120.

Figure 17:
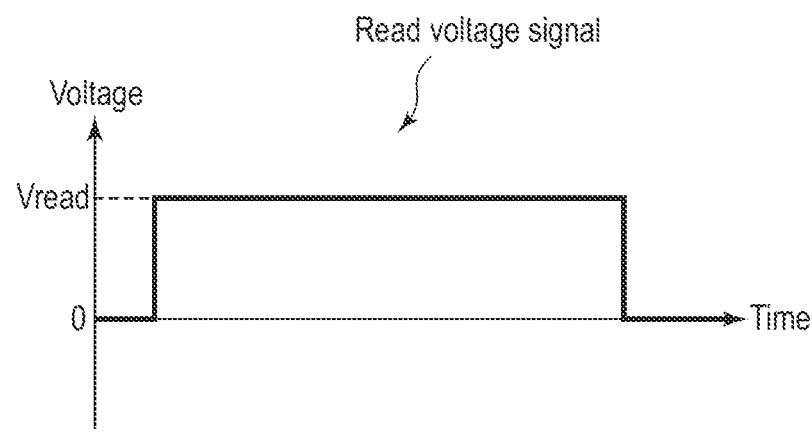
FIG. 17 is a timing diagram showing a read voltage signal applied to a memory cell when carrying out a read operation in the memory device of the first embodiment.

FIG. 17 is a timing diagram showing the read voltage signal applied to the memory cell 130 when carrying out a read operation.

When a read operation is carried out, the read voltage Vread is applied to the memory cell 130. More specifically, the read voltage Vread shown in FIG. 13 is applied to the memory cell 130 during the read operation. As a result, when a low-resistance state is set to the resistance change memory element 140, the selector element 150 is set to the on-state, and when a high-resistance state is set to the resistance change memory element 140, the selector element 150 is set to the off-state.

Therefore, when a low-resistance state is set to the resistance change memory element 140, a relatively large current flows through the memory cell 130, and when a high-resistance state is set to the resistance change memory element 140, substantially no current flows through the memory cell 130. Therefore, by detecting the value (voltage value or current value) based on the current flowing in the memory cell 130 with the detection circuit 320 shown in FIG. 8, the data stored in the memory cell 130 can be detected.

As described above, in this embodiment, it is possible to secure a sufficient difference between the threshold voltage Vth of the memory cell 130 in the case of a set write and the threshold voltage Vth of the memory cell 130 in the case of a reset write, and therefore the read voltage Vread can be set precisely. Thus, correct data can be reliably read out from the memory cell 130 during a reading operation, and a nonvolatile memory device with high reliability can be obtained.

Second Embodiment

Next, a memory device (resistance change type nonvolatile memory device) of the second embodiment will be described. The basic items here are similar to those of the first embodiment, and the descriptions on the items explained in the first embodiment will be omitted.

Figure 18:
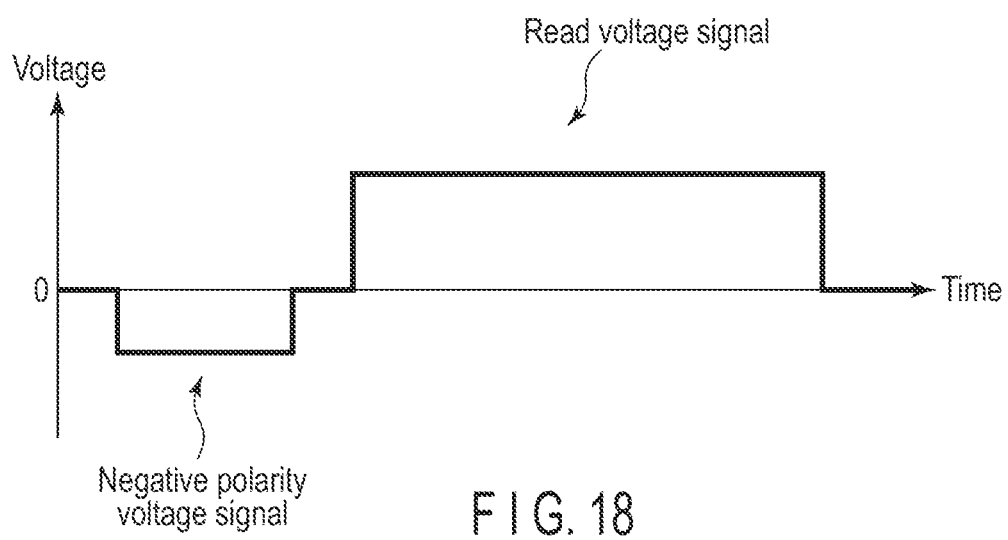
FIG. 18 is a timing diagram showing the operation of a memory device according to the second embodiment.

FIG. 18 is a timing diagram showing the operation of this embodiment.

In the first embodiment, a negative polarity voltage signal is applied immediately after the write voltage signal is applied, but in this embodiment, as shown in FIG. 18, the negative polarity voltage signal is not applied immediately after the write voltage signal is applied.

In this embodiment, as shown in FIG. 18, a negative polarity voltage signal is applied to the memory cell 130 immediately before reading out data based on the resistance state set to the resistance change memory element 140 by applying a read voltage signal having a positive polarity to the memory cell 130. More specifically, based on the read instruction signal that instructs to apply a read voltage signal to the memory cell 130, voltage is applied from the voltage application circuit 210 shown in FIG. 7 to one terminal of the memory cell 130 via the word line 110, and voltage is applied from the voltage application circuit 310 shown in FIG. 8 to the other terminal of the memory cell 130 via the bit line 120.

As described above, in this embodiment as well, a negative polarity voltage signal is applied to the memory cell 130 after the write operation but before the read voltage signal is applied. Thus, according to this embodiment, it is possible to achieve effects similar to those of the first embodiment, and a nonvolatile memory device having high reliability can be obtained.

Third Embodiment

Next, a memory device (resistance change type nonvolatile memory device) of the third embodiment will be described. The basic items here are similar to those of the first embodiment, and the descriptions on the items explained in the first embodiment will be omitted.

Figure 19:
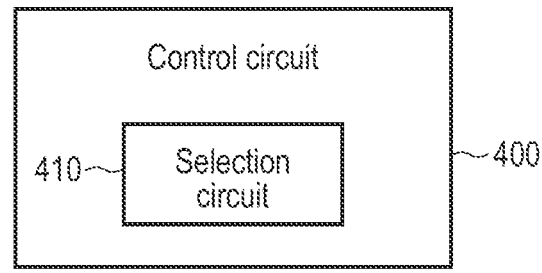
FIG. 19 is a block diagram showing a functional configuration of a control circuit of a memory device according to the third embodiment.

FIG. 19 is a block diagram showing a functional configuration of the control circuit 400 shown in FIG. 1.

As shown in FIG. 19, the control circuit 400 includes a selection circuit 410 that selects a first voltage application operation or a second voltage application operation.

In the first voltage application operation, as in the case of the first embodiment, after a write voltage signal is applied to the memory cell 130 by the voltage application circuits 210 and 310 (see FIGS. 7 and 8), a negative polarity voltage signal is applied to the memory cell 130 in the case of a reset write, whereas in the case of a set write, no negative polarity voltage signal is applied to the memory cell 130.

On the other hand, in the second voltage application operation, after the write voltage signal is applied to the memory cell 130 by the voltage application circuits 210 and 310, the negative polarity voltage signal is not applied to the memory cell 130 in both cases of the reset write and the set write.

In the first voltage application operation mode, by applying the negative polarity voltage signal, the reliability of data can be enhanced (lowering the data error rate), but the time spent in the write sequence is prolonged due to applying the negative polarity voltage signal. On the other hand, in the second voltage application operation mode, the negative polarity voltage signal is not applied, and therefore, the time spent in the write sequence can be shortened, but the data reliability is lowered (raising the data error rate).

In consideration of the characteristics of each of the first and second voltage application operation modes described above, the first voltage application operation mode or the second voltage application operation mode can be selected, for example, as follows.

In the first method, the first voltage application operation mode or the second voltage application operation mode is selected based on the access rate (access frequency) with respect to the memory cells 130. More specifically, when the access rate is lower than a predetermined value, the first voltage application operation mode is selected, whereas when the access rate is higher than the predetermined value, the second voltage application operation mode is selected.

In the second method, the first voltage application operation mode or the second voltage application operation mode is selected based on the error rate of data read from the memory cells 130. More specifically, when the error rate is higher than a predetermined value, the first voltage application operation mode is selected, whereas when the error rate is lower than the predetermined value, the second voltage application operation mode is selected.

As described above, with use of the first voltage application operation mode and the second voltage application operation mode, it is possible to improve the data reliability and enhance the operation speed.

In order to improve the data reliability in the second voltage application operation mode, it is preferable to carry out data patrol and refresh the memory cell 130 at regular intervals. In other words, the data is read from the memory cells 130 at regular intervals and the same data as that read is re-written to the memory cell 130.

FIGS. 20 to 23 are each a timing diagram illustrating the refresh operation carried out in the second voltage application operation mode.

FIG. 20 shows a refresh operation when a set state is set to the memory cell 130, that is, a low-resistance state is set to the resistance change memory element 140. As shown in the figure, after a read operation is carried out, a rewrite (set write) is carried out to refresh the memory cell 130.

FIG. 21 shows a first example of the refresh operation when a reset state is set to the memory cell 130, that is, a high-resistance state is set to the resistance change memory element 140. In the first example, after a read operation is carried out, a rewrite (reset write) is carried out to refresh the memory cell 130.

FIG. 22 shows a second example of the refresh operation when the reset state is set to the memory cell 130. In the second example, after a read operation is carried out, a rewrite (reset write) is carried out and further a negative polarity voltage signal is applied to the memory cell 130. As already described, the threshold voltage Vth of the memory cell 130 decreases immediately after a write operation is carried out. Therefore, immediately after the reset rewrite is carried out, the difference between the threshold voltage Vth in the set state and the threshold voltage Vth in the reset state is smaller. Here, by applying a negative polarity voltage signal to the memory cell 130 immediately after carrying out the reset rewrite, it is possible to increase the difference between the threshold voltage Vth in the set state and the threshold voltage Vth in the reset state.

Figure 23:
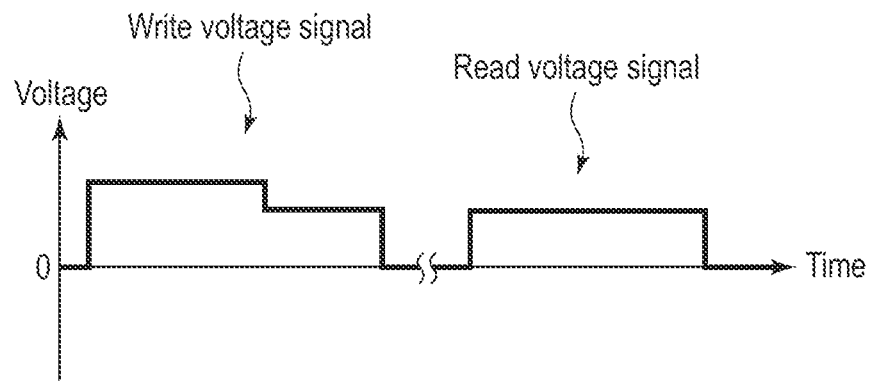
FIG. 23 is a timing diagram showing a third example of the refresh operation when a reset state is set to a memory cell in the memory device of the third embodiment.

FIG. 23 shows a third example of the refresh operation when the reset state is set to the memory cell 130. In the third example, no rewrite operation is carried out after the read operation is carried out. As described above, immediately after the reset rewrite is carried out, the difference between the threshold voltage Vth in the set state and the threshold voltage Vth in the reset state is smaller. By not carrying out the reset rewrite, it is possible to suppress such a problem.

Fourth Embodiment

Next, a memory device (resistance change type nonvolatile memory device) of the fourth embodiment will be described. The basic items here are similar to those of the first embodiment, and the descriptions on the items explained in the first embodiment will be omitted.

Figure 24:
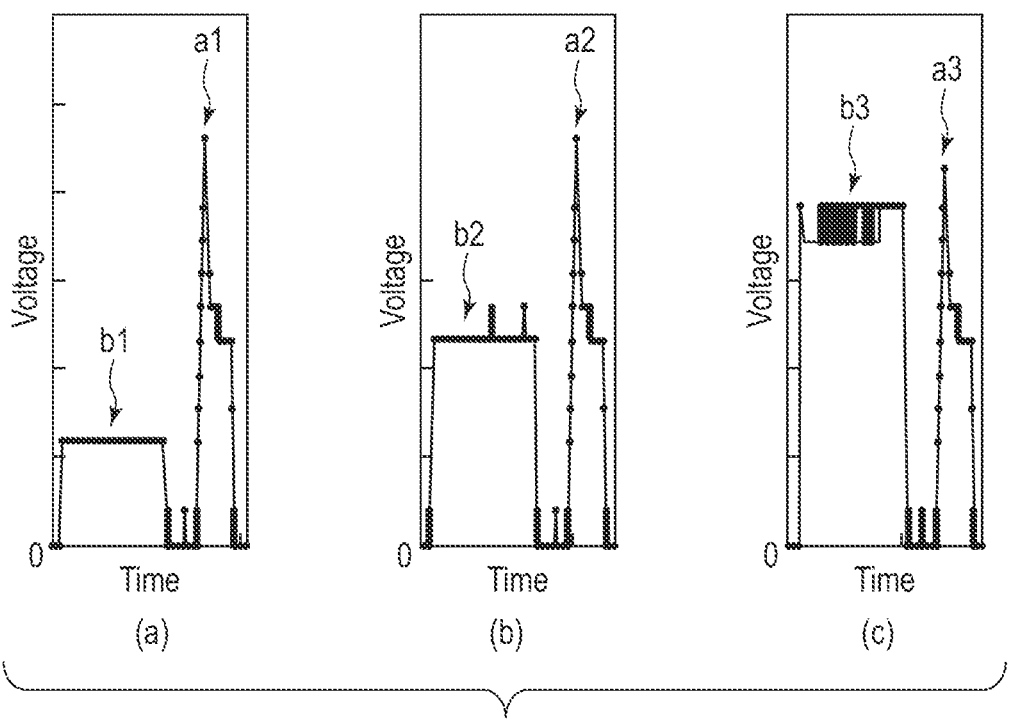
FIG. 24 is a diagram showing results of the measurement of the on-characteristics of the selector element 150 when the applied voltage to the selector element is varied in the memory device according to the fourth embodiment.

FIG. 24 is a diagram showing results of measurement of the on-characteristics of the selector element 150 when the applied voltage to the selector element 150 is varied. The horizontal axis indicates the time, and the vertical axis indicates the applied voltage to the selector element 150.

FIG. 24, in parts (a), (b) and (c), illustrates on-voltages a1, a2, and a3 applied to the selector element 150, and voltages b1, b2, and b3, which are lower than the voltage at which the selector element 150 is set to the on-state.

As can be seen from FIG. 24, parts (a), (b) and (c), the on-voltage a3 of the selector element 150 after the voltage b3 is applied is lower than the on-voltages a1 and a2 after the voltages b1 and b2 are applied. From this, it can be understood that even if the voltage b3 is lower than the voltage at which the selector element 150 is set to the on-state, the on-voltage of the selector element 150 is lowered by applying in advance a voltage having a certain magnitude to the selector element 150.

FIG. 25 is a timing diagram showing the voltage signals applied to the memory cell 130 when the read operation of this embodiment is carried out. The read operation of this embodiment is based on the items explained with reference to FIG. 24.

First, based on the read instruction signals shown in FIGS. 7 and 8, a positive polarity voltage signal (a first polarity voltage signal) having a positive polarity and a magnitude that does not set the selector element 150 to the on-state is applied to the memory cell 130. After the positive polarity voltage signal is applied to the memory cell 130, the read voltage signal is applied to the memory cell 130. As a result, the selector element 150 is set to the on-state and the data based on the resistance state set to the resistance change memory element 140 is read out from the memory cell 130.

Note that in the example shown in FIG. 25, the read voltage signal is applied a certain period of time after the application of the positive polarity voltage signal, but the read voltage signal may be applied continuously after the application of the positive polarity voltage signal.

Figure 26:
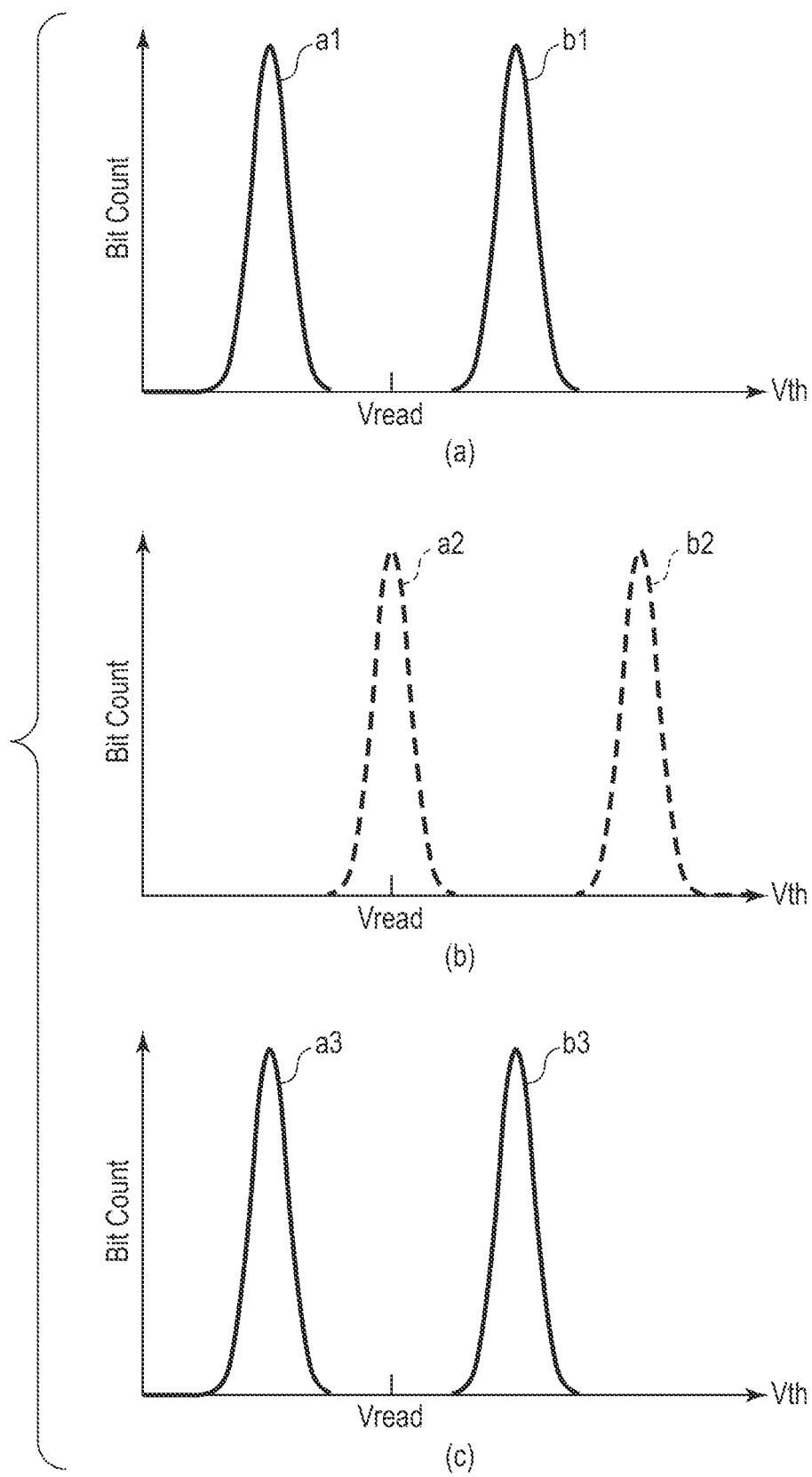
FIG. 26 is a diagram showing the time variation of the distribution of the threshold voltage of a memory cell when a read operation is carried out in the memory device according to the fourth embodiment.

FIG. 26 is a diagram showing the time variation of the distribution of the threshold voltage Vth of the memory cell 130 when the read operation of this embodiment is carried out. In FIG. 26, part (a) indicates the distribution characteristics of the threshold voltage Vth immediately after carrying out a write, part (b) indicates the distribution characteristic of the threshold voltage Vth when a sufficient time has elapsed after the write, and part (c) is the distribution characteristic of the threshold voltage Vth after applying the positive polarity voltage signal shown in FIG. 25 to the memory cell 130. Curves a1, a2 and a3 indicate the distribution characteristics when a set write is carried out, and curves b1, b2 and b3 indicate the distribution characteristics when a reset write is carried out.

As explained with reference to FIG. 24, by applying in advance a voltage having a certain magnitude to the selector element 150, the on-voltage of the selector element 150 is lowered. Accordingly, the threshold voltage Vth of the memory cell 130 decreases as well. Thus, by applying a positive polarity voltage signal having a magnitude that does not set the selector element 150 to the on-state to the memory cell 130 before applying the read voltage signal, it is possible to shift the distribution characteristics of the threshold voltage Vth from curves (b) to curves (c) in FIG. 26.

As described above, in this embodiment, the read voltage signal is applied after the positive polarity voltage signal is applied. By thus applying the positive polarity voltage signal, it is possible to lower (restore) the threshold voltage Vth that has risen after a write operation. That is, the threshold voltage Vth can be lowered (restored) in both cases of the set write and the reset write. Therefore, it is possible to prevent the difference between the threshold voltage Vth in the case of a set write and the threshold voltage Vth in the case of a reset write from becoming small, and the read voltage Vread can be accurately set. As a result, correct data can be reliably read from the memory cell 130 during the read operation, and therefore a nonvolatile memory device with high reliability can be obtained. Further, the read voltage Vread can be lowered, and therefore the power consumption can be reduced as well.

In each of the above-mentioned embodiments, for the resistance change memory element 140, not only PCM and iPCM elements, but also, other resistance change memory elements which can store data based on the resistance state (a low-resistance state and a high-resistance state) can be adopted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first wiring line extending along a first direction;
a second wiring line extending along a second direction intersecting the first direction;
a memory cell connected between the first wiring line and the second wiring line, including a resistance change memory element having a first resistance state and a second resistance state having a resistance higher than that of the first resistance state, and a two-terminal switching element connected in series to the resistance change memory element, and storing data based on a resistance state set to the resistance change memory element;
a voltage application circuit which applies a write voltage signal having a first polarity and setting a desired resistance state to the resistance change memory element by setting the two-terminal switching element to an on-state, to the memory cell, and applies, after the write voltage signal is applied to the memory cell, a second polarity voltage signal having a second polarity opposite to the first polarity and having a magnitude that prevents the two-terminal switching element from being set to the on-state, to the memory cell; and a selection circuit which selects whether to carry out a first voltage application operation in which the second polarity voltage signal is applied to the memory cell after the write voltage signal is applied by the voltage application circuit, or to carry out a second voltage application operation in which the second polarity voltage signal is not applied to the memory cell after the write voltage signal is applied by the voltage application circuit.

2. The device of claim 1, wherein
the desired resistance state is the second resistance state.

3. The device of claim 1, wherein
the two-terminal switching element has a characteristic of changing from an off-state to the on-state when a voltage applied between two terminals thereof is equal to or greater than a first voltage.

4. The device of claim 3, wherein
the two-terminal switching element has a characteristic of changing from the on-state to the off-state when a voltage applied between the two terminals thereof decreases to be equal to or lower than a second voltage lower than the first voltage.

5. The device of claim 3, wherein
the two-terminal switching element has a characteristic wherein the first voltage decreases when the two-terminal switching element is changed from the off-state to the on-state, and the first voltage increases with time after the two-terminal switching element is changed to the on-state.

6. The device of claim 1, wherein
a voltage to be applied to the memory cell to set the two-terminal switching element to the on-state when the second resistance state is set to the resistance change memory element is greater than a voltage to be applied to the memory cell to set the two-terminal switching element to the on-state when the first resistance state is set to the resistance change memory element.

7. The device of claim 1, wherein
the voltage application circuit applies to the memory cell, a read voltage signal in which the two-terminal switching element is in the on-state when the first resistance state is set to the resistance change memory element, and the two-terminal switching element is in an off-state when the second resistance state is set to the resistance change memory element, when reading data based on the resistance state set to the resistance change memory element from the memory cell.

8. The device of claim 7, further comprising:
a detection circuit which detects a value based on a current flowing through the memory cell when the read voltage signal is applied to the memory cell.

9. The device of claim 1, wherein
the voltage application circuit applies the write voltage signal and the second polarity voltage signal to the memory cell based on a write instruction signal that instructs to apply the write voltage signal to the memory cell.

10. The device of claim 1, wherein
the voltage application circuit applies the second polarity voltage signal to the memory cell based on a read instruction signal that instructs to apply a read voltage signal to the memory cell, before reading data based on the resistance state set to the resistance change memory element from the memory cell by applying the read voltage signal to the memory cell.

11. The device of claim 1, wherein
the first resistance state or the second resistance state is set to the resistance change memory element according to a falling waveform of the write voltage signal.

12. The device of claim 1, wherein
the resistance change memory element is a phase change memory (PCM) element or an interfacial phase change memory (iPCM) element.

13. The device of claim 1, wherein,
when the voltage application circuit is selected by the selection circuit to perform the second voltage application operation, the voltage application circuit applies a read voltage signal for reading data based on the resistance state set to the resistance change memory element to the memory cell by setting the two-terminal switching element to the on-state, and when the data read from the memory cell by applying the read voltage signal to the memory cell is data based on the first resistance state of the resistance change memory element, the voltage application circuit applies a rewrite voltage signal to re-set the first resistance state to the resistance change memory element to the memory cell.

14. The device of claim 1, wherein
when the voltage application circuit is selected by the selection circuit to perform the second voltage application operation, the voltage application circuit applies a read voltage signal for reading data based on the resistance state set to the resistance change memory element to the memory cell by setting the two-terminal switching element to the on-state, and when the data read from the memory cell by applying the read voltage signal to the memory cell is data based on the second resistance state of the resistance change memory element, the voltage application circuit applies a rewrite voltage signal to re-set the second resistance state to the resistance change memory element to the memory cell.

15. The device of claim 14, wherein
the voltage application circuit applies to the memory cell a voltage having the second polarity and having a magnitude that prevents the two-terminal switching element from being set to the on-state, after applying the rewrite voltage signal to the memory cell.

* * * * *